US011292511B2

(12) United States Patent
Tashima (10) Patent No.: US 11,292,511 B2
(45) Date of Patent: Apr. 5, 2022

(54) ELECTRONIC CONTROL UNIT AND ELECTRIC POWER STEERING APPARATUS HAVING THE SAME

(71) Applicant: DENSO CORPORATION, Kariya (JP)

(72) Inventor: Tsuyoshi Tashima, Kariya (JP)

(73) Assignee: DENSO CORPORATION, Kariya (JP)

( * ) Notice: Subject to any disclaimer, the term of this patent is extended or adjusted under 35 U.S.C. 154(b) by 172 days.

(21) Appl. No.: 16/710,293

(22) Filed: Dec. 11, 2019

(65) Prior Publication Data

US 2020/0108859 A1    Apr. 9, 2020

Related U.S. Application Data

(63) Continuation of application No. PCT/JP2018/022059, filed on Jun. 8, 2018.

(30) Foreign Application Priority Data

Jun. 14, 2017   (JP) .............................. JP2017-116578

(51) Int. Cl.
*B62D 5/04* (2006.01)
*H02K 11/33* (2016.01)
*H02P 7/03* (2016.01)
*H02K 5/22* (2006.01)
*H02K 9/22* (2006.01)

(52) U.S. Cl.
CPC ........... *B62D 5/0463* (2013.01); *H02K 5/225* (2013.01); *H02K 9/22* (2013.01); *H02K 11/33* (2016.01); *H02P 7/04* (2016.02); *H02K 2211/03* (2013.01)

(58) Field of Classification Search
CPC .... B62D 5/0463; B62D 5/0406; H02K 11/33; H02K 5/225; H02K 9/22; H02K 2211/03; H02P 7/04; H02P 29/68; H05K 7/20; H02M 7/48; H01L 23/36
USPC .......................................................... 310/64
See application file for complete search history.

(56) References Cited

U.S. PATENT DOCUMENTS

| | | | | |
|---|---|---|---|---|
| 8,467,193 | B2 * | 6/2013 | Oota | .................. H05K 7/20854 |
| | | | | 361/753 |
| 9,326,368 | B2 * | 4/2016 | Nishimoto | ........... H05K 3/3415 |
| 9,755,569 | B2 | 9/2017 | Muramatsu | |
| 9,894,804 | B2 * | 2/2018 | Shibata | ................ H05K 1/0204 |
| 10,674,639 | B2 * | 6/2020 | Shibata | ................ B62D 5/0406 |
| 11,084,521 | B2 * | 8/2021 | Tashima | ............... H05K 1/0203 |

(Continued)

FOREIGN PATENT DOCUMENTS

| | | |
|---|---|---|
| JP | 5967071 B | 8/2016 |
| JP | 2016-197683 A | 11/2016 |

(Continued)

*Primary Examiner* — John K Kim
(74) *Attorney, Agent, or Firm* — Maschoff Brennan (57) ABSTRACT

An electronic control unit is for controlling driving of a motor having a winding, and includes a substrate, a plurality of switching elements, a plurality of motor relay elements and a connector. The switching elements are mounted on the substrate, and provide an inverter circuit to switch electric conduction to the winding. The motor relays are mounted on the substrate, and are connected between the inverter circuit and the winding. The connector includes a plurality of motor terminals connected to the winding, and is connected to the substrate. All of the motor relay elements are arranged adjacent to the corresponding motor terminals.

11 Claims, 10 Drawing Sheets

(56) References Cited

U.S. PATENT DOCUMENTS

| | | | |
|---|---|---|---|
| 2012/0145472 A1 | 6/2012 | Imamura et al. | |
| 2015/0189734 A1* | 7/2015 | Nishimoto | H05K 3/3415 |
| | | | 701/41 |
| 2015/0189794 A1* | 7/2015 | Tashima | H05K 7/1432 |
| | | | 180/446 |
| 2016/0295683 A1 | 10/2016 | Uchida | |
| 2016/0295740 A1* | 10/2016 | Shibata | H05K 7/20472 |
| 2016/0301350 A1* | 10/2016 | Muramatsu | H02P 29/024 |
| 2018/0201302 A1* | 7/2018 | Sonoda | H02K 11/215 |
| 2020/0108859 A1* | 4/2020 | Tashima | H02M 7/48 |

FOREIGN PATENT DOCUMENTS

| | | |
|---|---|---|
| JP | 2016-197685 A | 11/2016 |
| JP | 2016-201898 A | 12/2018 |
| WO | 2017/046940 A | 3/2017 |

\* cited by examiner

ELECTRONIC CONTROL UNIT AND ELECTRIC POWER STEERING APPARATUS HAVING THE SAME

CROSS REFERENCE TO RELATED APPLICATIONS

The present application is a continuation application of International Patent Application No. PCT/JP2018/022059 filed on Jun. 8, 2018, which designated the U.S. and claims the benefit of priority from Japanese Patent Application No. 2017-116578 filed on Jun. 14, 2017. The entire disclosures of all of the above applications are incorporated herein by reference.

TECHNICAL FIELD

The present disclosure relates to an electronic control unit and an electric power steering apparatus having the same.

BACKGROUND

For example, there is known an electronic control unit that radiates heat generated from a semiconductor module to another member, such as a heat sink.

SUMMARY

The present disclosure provides an electronic control unit for controlling driving of a motor having a winding. The electronic control unit includes a substrate, a plurality of switching elements, a plurality of motor relay elements, and a connector. The switching elements are mounted on the substrate and form an inverter circuit associated with switching of energization to the winding. The motor relay elements are mounted on the substrate and connected between the inverter circuit and the winding. The connector has a plurality of motor terminals connected to the winding, and is connected to the substrate. All of the motor relay elements are arranged correspondingly adjacent to the motor terminals.

BRIEF DESCRIPTION OF DRAWINGS

Features and advantages of the present disclosure will become more apparent from the following detailed description made with reference to the accompanying drawings, and in which.

DETAILED DESCRIPTION

For example, an electronic control unit for controlling a driving of a motor is configured to radiate heat generated from a semiconductor module to another member, such as a heat sink. A motor relay element provided between an inverter and a motor winding may be required to have a high heat radiation property, because a relatively large amount of current continuously flows in the motor relay element during driving of a motor.

According to an aspect of the present disclosure, an electronic control unit is for controlling driving of a motor having a winding, and includes a substrate, a plurality of switching elements, a plurality of motor relay elements, and a connector. The switching elements are mounted on the substrate and form an inverter circuit associated with switching of energization to the winding. The motor relay elements are mounted on the substrate and connected between the inverter circuit and the winding. The connector has a plurality of motor terminals connected to the winding, and is connected to the substrate. All of the motor relay elements are arranged correspondingly adjacent to the motor terminals.

Accordingly, heat generated in the motor relay elements can be appropriately radiated toward the connector.

An electronic control unit and an electric power steering apparatus using the electronic control unit of the present disclosure will be hereinafter described with reference to the drawings. Hereinafter, in a plurality of embodiments, substantially the same components are denoted by the same reference numerals, and descriptions of the same components will be omitted.

First Embodiment

Figure 1:
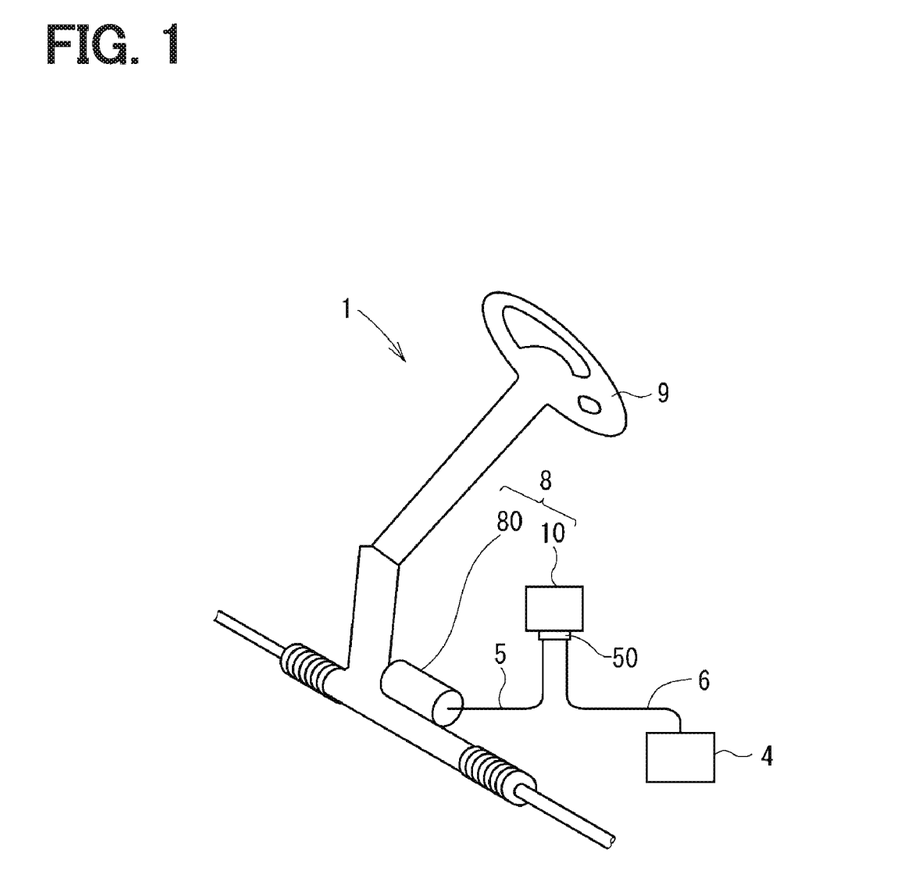
FIG. 1 is a schematic diagram illustrating an electric power steering system according to a first embodiment.

An electronic control unit and an electric power steering apparatus according to a first embodiment will be described with reference to FIGS. 1 to 13. As shown in FIG. 1, an electronic control unit 10 is used in an electric power steering system 1 for a vehicle. The electronic control unit 10 controls driving of a motor 80 that generates a steering assist force, based on a steering torque signal acquired from a torque sensor (not shown), a vehicle speed signal acquired from a vehicle communication network such as a CAN (Controller Area Network), and the like. The electric power steering apparatus 8 includes the motor 80, which outputs an assist torque for assisting a driver's steering operation of a steering wheel 9, the electronic control unit 10, and the like. The electronic control unit 10 is coupled to the motor 80 via a connector 50 and a wiring 5. The electronic control unit 10 is coupled to a battery 4 via the connector 50 and a wiring 6. Thus, electric power of the battery 4 is supplied to the motor 80. The motor 80 is a brushed motor and includes a winding 81 (see FIG. 2).

Figure 2:
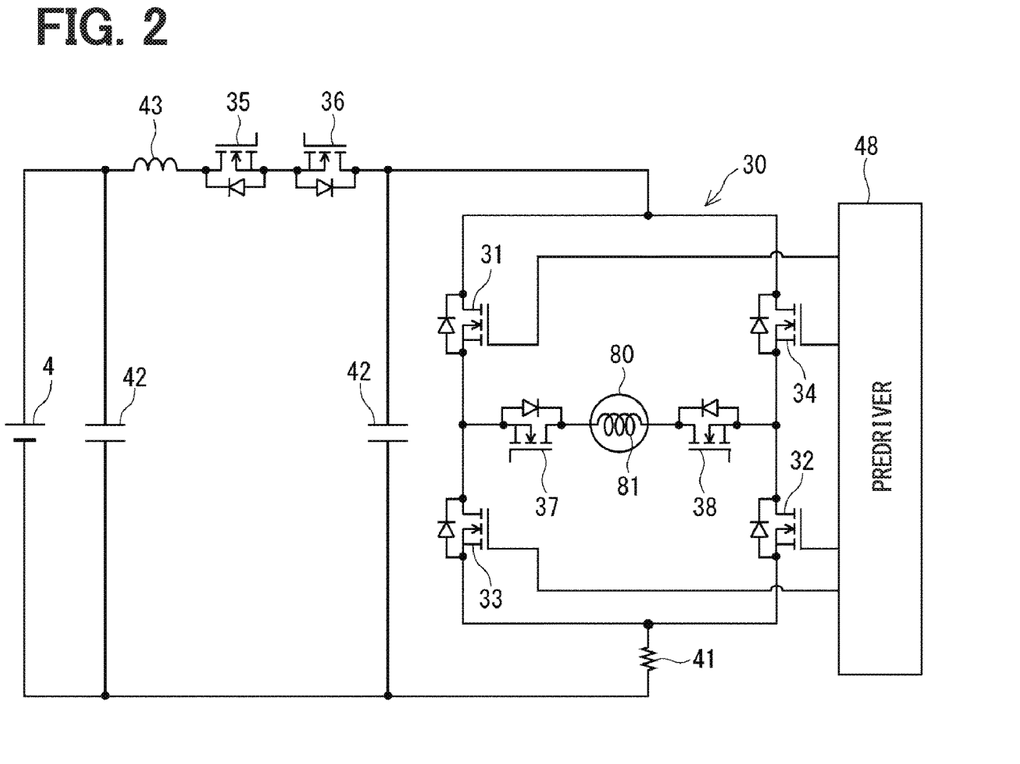
FIG. 2 is a circuit diagram illustrating a circuit configuration of an electronic control unit according to the first embodiment.
Figure 3:
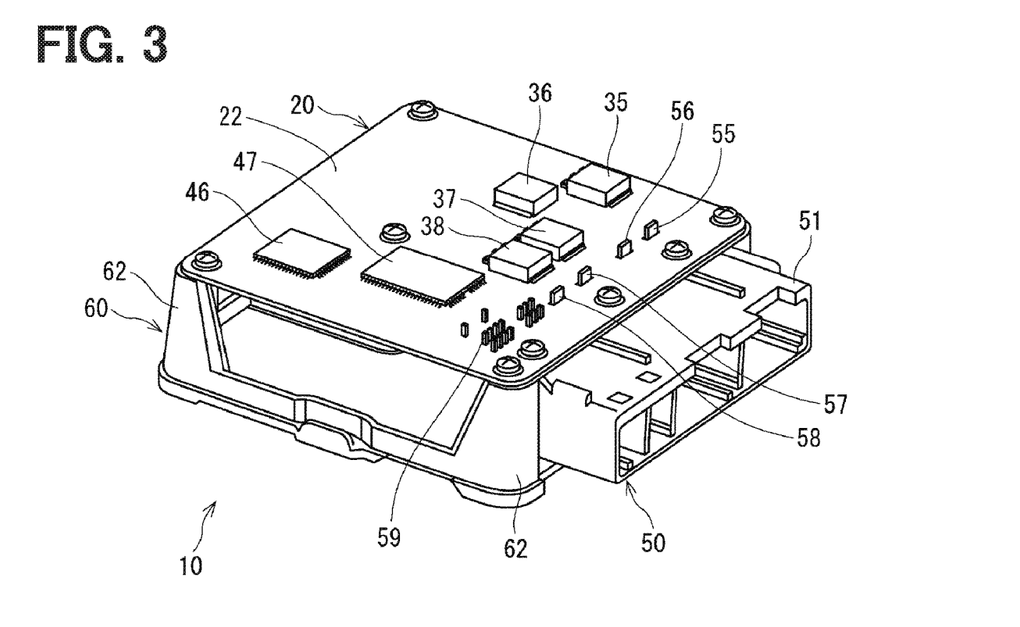
FIG. 3 is a diagram illustrating a perspective view of the electronic control unit according to the first embodiment.
Figure 4:
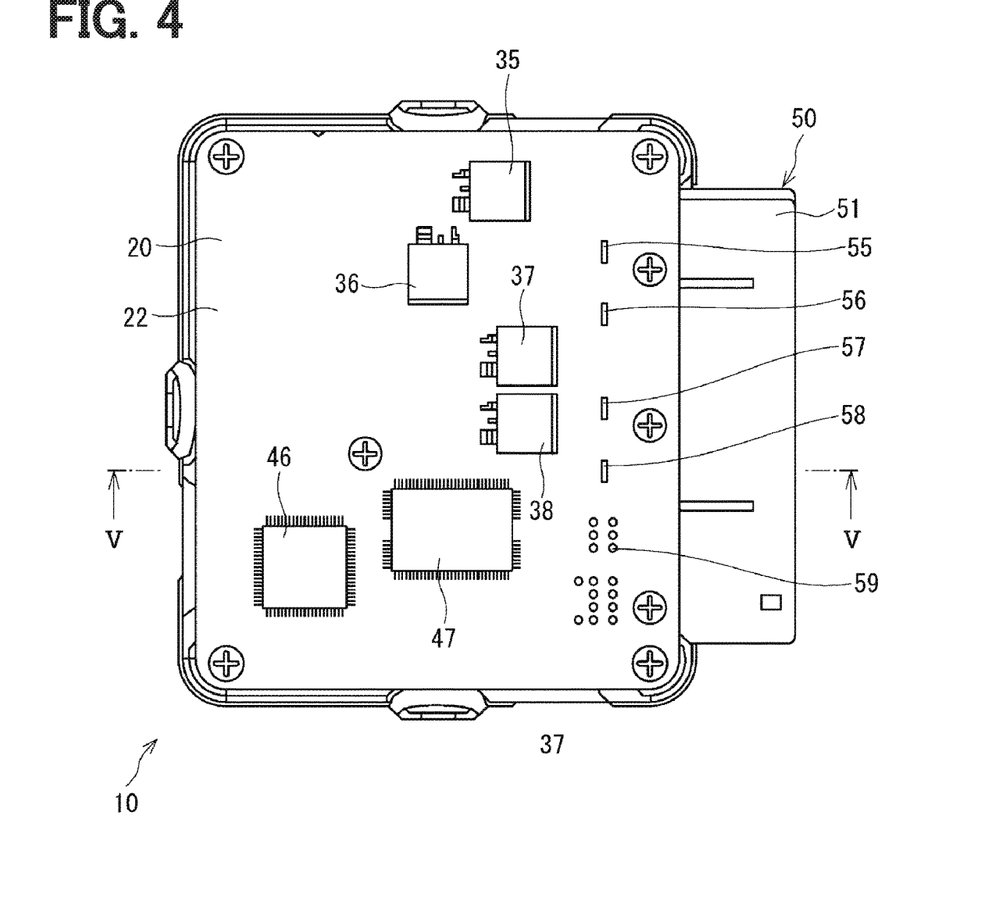
FIG. 4 is a diagram illustrating a plan view of the electronic control unit according to the first embodiment.

As shown in FIGS. 2 to 4, the electronic control unit 10 includes a substrate 20, switching elements 31 to 34, motor relay elements 37 and 38, a connector 50, a housing 60 and the like. Firstly, a circuit configuration of the electronic control unit 10 will be described with reference to FIG. 2. The inverter circuit 30 includes the switching elements 31 to 34. A series connection of the switching elements 31 and 33 and a series connection of the switching elements 32 and 34 are connected in parallel to form an H-bridge circuit. The driving of the motor 80 is controlled by controlling on and off operations of the switching elements 31 to 34. In the present embodiment, the switching elements 31 to 34, power supply relay elements 35 and 36, motor relay elements 37 and 38 are each provided by a MOSFET, but may be provided by a semiconductor element other than the MOSFET, such as an IGBT.

The power supply relay elements 35 and 36 are connected between the battery 4 and the inverter circuit 30 in such a manner that directions of parasitic diodes are opposite to each other. The motor relay elements 37 and 38 are connected in such a manner that directions of the parasitic diodes are opposite to each other. Specifically, the motor relay element 37 is connected in a direction that a cathode is adjacent to the winding 81, between an end of the winding 81 of the motor 80 and a connection point of the switching elements 31 and 33. The motor relay element 38 is connected in a direction that a cathode is adjacent to the winding 81, between the other end of the winding 81 and a connection point of the switching elements 32 and 34. The motor relay elements 37 and 38 are normally on during the driving of the motor 80.

The switching elements 31 and 32 and the motor relay elements 37 and 38 are turned on in order to rotate the motor 80 in a forward direction. Thus, an electric current flows through the path of the switching element 31, the motor relay element 37, the winding 81, the motor relay element 38 and the switching element 32. The switching elements 33 and 34 and the motor relay elements 37 and 38 are turned on in order to rotate the motor 80 in a reverse direction. Thus, an electric current flows through the path of the switching element 34, the motor relay element 38, the winding 81, the motor relay element 37 and the switching element 33.

Since the motor relay elements 37 and 38 are connected such that the parasitic diodes thereof are opposite in direction, the electric current between the inverter circuit 30 and the winding 81 can be interrupted irrespective of the direction of the electric current by turning off both of the motor relay elements 37 and 38. Thus, when the electric power steering apparatus 8 is stopped, for example, due to an occurrence of abnormality, it is possible to restrict the steering operation from becoming heavy due to a regenerative current.

A shunt resistor 41 is coupled on a low potential side of the inverter circuit 30, and is used to detect an electric current flowing in the winding 81. Capacitors 42 are, for example, aluminum electrolytic capacitors, and are connected in parallel with the battery 4. The capacitors 42 accumulate electrical charges for assisting power supply to the inverter circuit 30 and for suppressing noise components such as a surge voltage. An inductor 43 is provided between the battery 4 and the power supply relay element 35.

As shown in FIGS. 3 and 4, the substrate 20 is a printed wiring board, such as an FR-4 made of a glass woven cloth and an epoxy resin. The substrate 20 is fixed to the housing 60 with screws or the like. The substrate 20 has a first surface 21 facing the housing 60, and a second surface 22 opposite to the housing 60. The substrate 20 has a power region Rp to which a relatively large amount of current is conducted and a control region Rc to which a relatively small amount of current is conducted, which are divided at a boundary line L (see FIGS. 7 and 8). The regions Rp and Rc may be divided by a wiring pattern or by an imaginary line.

Figure 7:
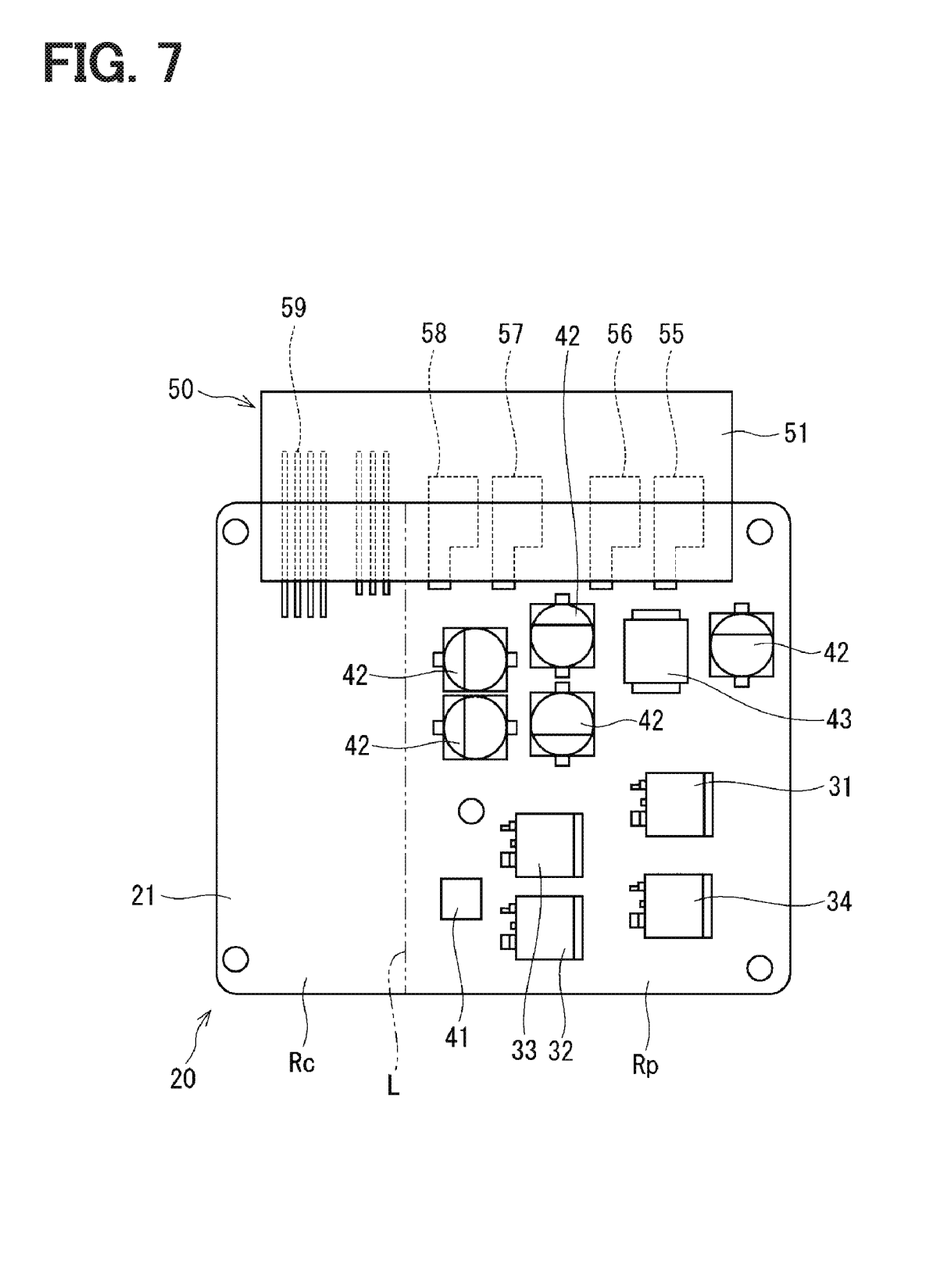
FIG. 7 is a schematic diagram for explaining the arrangement of components on a first surface side of a substrate according to the first embodiment.

As shown in FIG. 7, the switching elements 31 to 34, the shunt resistor 41, the capacitors 42, and the inductor 43 are mounted in the power region Rp on the first surface 21 the present embodiment, the capacitors 42 and the inductor 43 are mounted in a region adjacent to the connector 50, and the switching elements 31 to 34 and the shunt resistor 41 are mounted in a region farther from the connector 50 than the capacitors 42 and the inductor 43.

Figure 8:
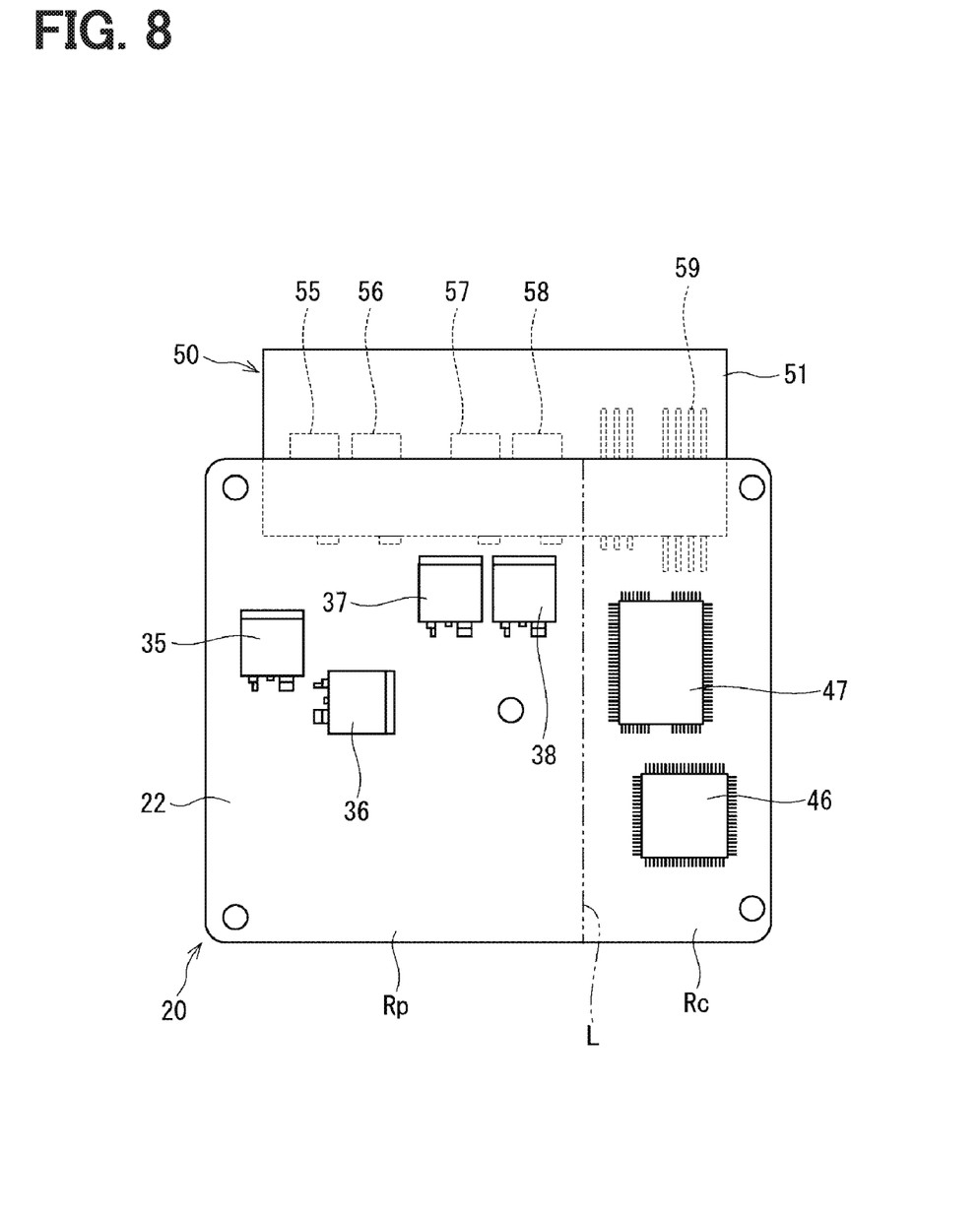
FIG. 8 is a schematic diagram for explaining the arrangement of components on a second surface side of the substrate according to the first embodiment.

As shown in FIG. 8, the power supply relay elements 35 and 36 and the motor relay elements 37 and 38 are mounted in the power region Rp on the second surface 22. The relay elements 35 to 38 are generally mounted in a region corresponding to the back side of the capacitors 42 and the inductor 43. A microcomputer 46 and a custom IC 47 are mounted in the control region Rc on the second surface 22.

The microcomputer 46 generates a drive signal based on a steering torque signal, a vehicle speed signal, and the like, which are input via the connector 50. The custom IC 47 includes a pre-driver 48 (see FIG. 2) and the like. The drive signal generated by the microcomputer 46 is output to the switching elements 31 to 34, the power supply relay elements 35 and 36, and the motor relay elements 37 and 38 via the pre-driver 48. Thus, switching of each of the switching elements 31 to 34, the power supply relay elements 35 and 36, and the motor relay elements 37 and 38 is controlled.

As shown in FIG. 3 and the like, the connector 50 is provided on the first surface 21 of the substrate 20. The connector 50 includes a connector main body 51, power supply terminals 55 and 56, motor terminals 57 and 58, and a control terminal 59. The terminals 55 to 59 are disposed to protrude from the connector main body 51. The terminals 55 to 59 are inserted to the substrate 20 from the first surface 21 side toward the second surface 22 side, and are electrically connected to the substrate 20 by solder or the like. The power supply terminals 55 and 56 are connected to the battery 4 and are used for power supply from the battery 4 to the electronic control unit 10. The motor terminals 57 and 58 are used for connecting between the electronic control unit 10 and the motor 80. The control terminal 59 is used for exchanging information with a sensor such as a torque sensor provided outside the electronic control unit 10 or CAN. In the present embodiment, the power supply terminals 55 and 56, the motor terminals 57 and 58, and the control terminal 59 correspond to "connection terminals".

Figure 5:
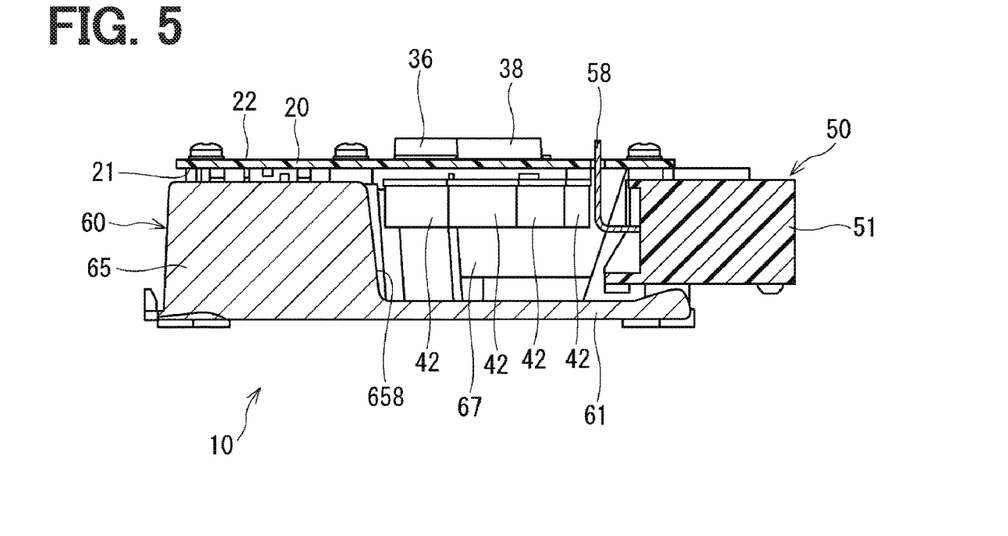
FIG. 5 is a diagram illustrating a cross-sectional view taken along a line V-V in FIG. 4.
Figure 6:
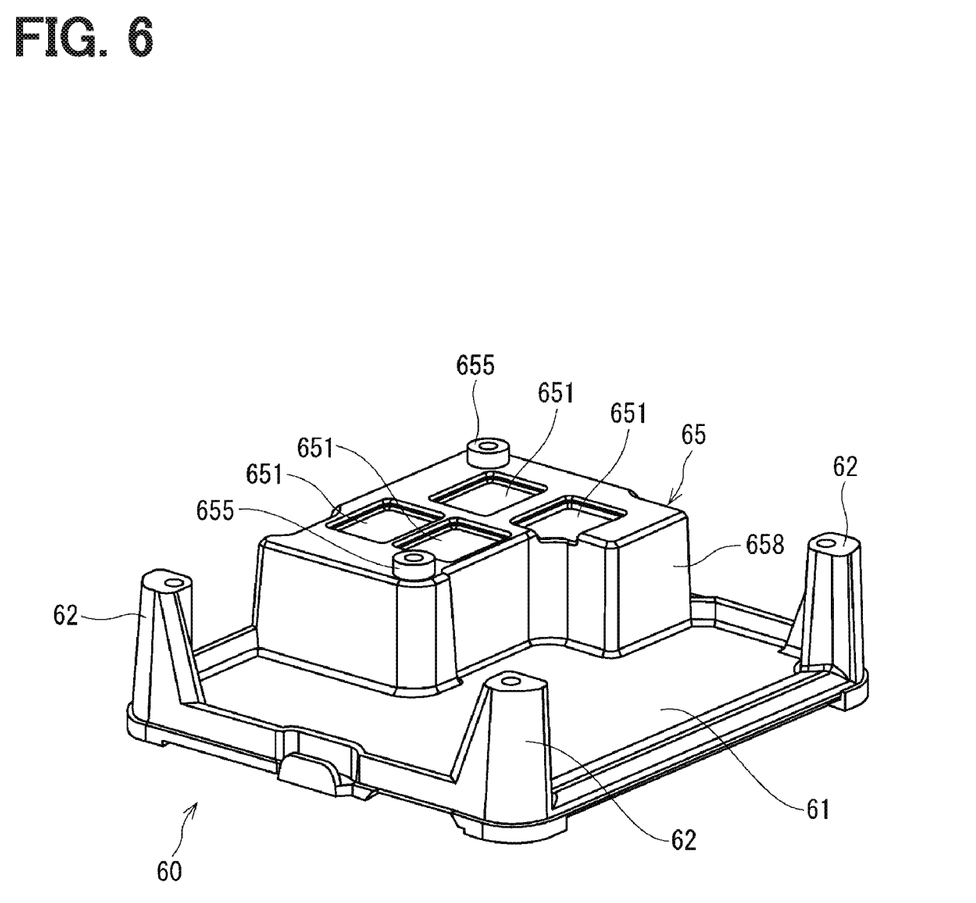
FIG. 6 is a diagram u rating a perspective view of a housing according to the first embodiment.

As shown in FIGS. 5 and 6, the housing 60 is formed of a metal, such as aluminum, having high thermal conductivity. The housing 60 includes a base portion 61, leg portions 62, and a heat sink portion 65. The base portion 61 has substantially a rectangular shape. The leg portions 62 are erected at three corners of the base portion 61 other than the part where the heat sink portion 65 is formed. The tip ends of the leg portions 62 are in contact with the first surface 21 of the substrate 20, and to which the substrate 20 is fixed with screws or the like.

The heat sink portion 65 is erected from the base portion 61 in a region where the switching elements 31 to 34 are mounted. The heat sink portion 65 has four accommodation chambers 651 on the surface facing the substrate 20. The switching elements 31 to 34 are respectively accommodated in the accommodation chambers 651. A heat radiation gen (not shown) is provided between the heat sink portion 65 and the switching elements 31 to 34. Thus, heat generated in accordance with the switching of the switching elements 31 to 34 is radiated to the housing 60 via the heat radiation gel. Note that a heat radiation sheet or a heat radiation grease may be used in place of the heat radiation gel. Alternatively, the switching elements 31 to 34 may be directly in contact with the heat sink portion 65 without using the heat radiation gel or the like. The heat sink portion 65 is provided with a substrate fixing portion 655. The tip end of the substrate fixing portion 655 is in contact with the first surface 21 of the substrate 20, and to which the substrate 20 is fixed with such as a screw.

In the present embodiment, an accommodation space 67 is provided by a region that is defined by an outer edge of the housing 60 and a side wall 658 of the heat sink portion 65, between the substrate 20 and the base portion 61. In the accommodation space 67, the capacitors 42 and the inductor 43, which are relatively large components, are arranged. Further, a part of the connector 50 is arranged in the accommodation space 67, and the front side of the connector main body 51 protrudes to the outside of the housing 60 from between the leg portions 62.

In the present embodiment, the power supply relay elements 35 and 36 and the motor relay elements 37 and 38 are mounted on the second surface 22 of the substrate 20, which is the surface opposite to the housing 60. For this reason, it is difficult to radiate heat generated in the relay elements 35 to 38 toward the housing 60. Also, as shown in FIG. 2, the motor 80 of this embodiment is a brushed motor and the inverter circuit 30 is an H-bridge circuit. Therefore, when current is circulating in the inverter circuit 30, though the electric current does not flow in the power supply relay elements 35 and 36, the electric current normally flows in the motor relay elements 37 and 38 during the driving of the motor 80. Therefore, the motor relay elements 37 and 38 generate a larger amount of heat than the power supply relay elements 35 and 36. The power supply relay elements 35 and 36, which generate a smaller amount of heat than the motor relay elements 37 and 38, are not arranged side by side with the motor relay elements 37 and 38, but are disposed away from the motor relay elements 37 and 38 so that the heat is radiated via the substrate 20.

Figure 11:
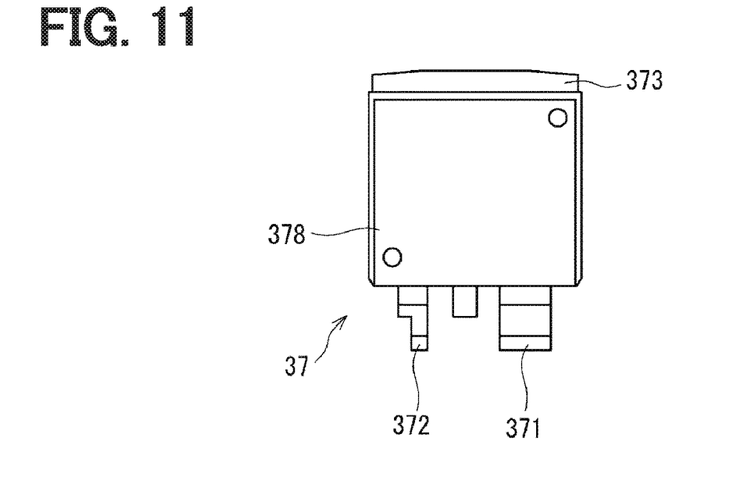
FIG. 11 is a diagram illustrating a plan view of the motor relay element according to the first embodiment.
Figure 12:
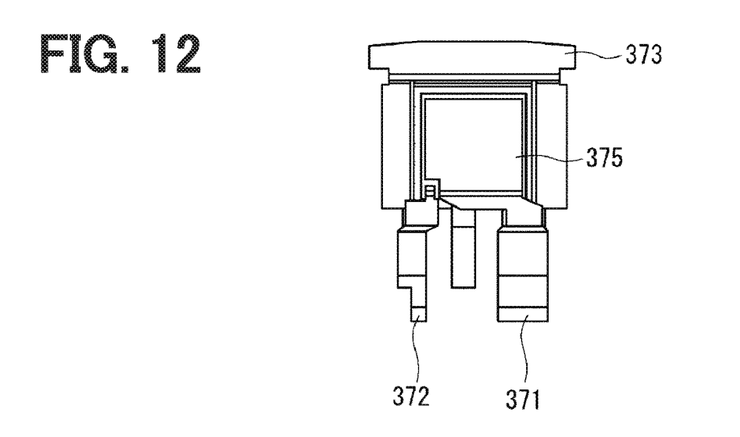
FIG. 12 is a diagram illustrating a plan view for explaining an internal configuration of the motor relay element according to the first embodiment.
Figure 13:
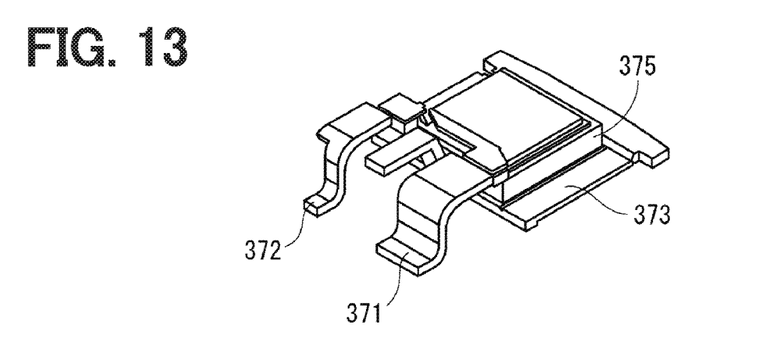
FIG. 13 is a diagram illustrating a perspective view for explaining the internal configuration of the motor relay element according to the first embodiment.

Details of the motor relay element 37 will be described with reference to FIGS. 11 to 13. FIGS. 12 and 13 show the motor relay element 37 in a state where the sealing portion 378 of the motor relay element 37 is removed. As shown in FIGS. 11 to 13, the motor relay element 37 includes a source terminal 371, a gate terminal 372, a drain terminal 373, a chip 375, and the sealing portion 378. The sealing portion 378 is made of a resin or the like into a substantially rectangular shape so as to seal the chip 375. The terminals 371 to 373 are formed to protrude from the sealing portion 378. The source terminal 371 and the gate terminal 372 protrude from an end of the sealing portion 378, and the drain terminal 373 protrudes from an end opposite to the end of the sealing portion 378 from which the terminals 371 and 372 protrude. The drain terminal 373 has substantially the same width as the sealing portion 378, The chip 375 is mounted on the drain terminal 373. In the present embodiment, the drain terminal 373 is the widest, and the source terminal 371 has the second widest width. The gate terminal 372 is the narrowest.

Figure 9:
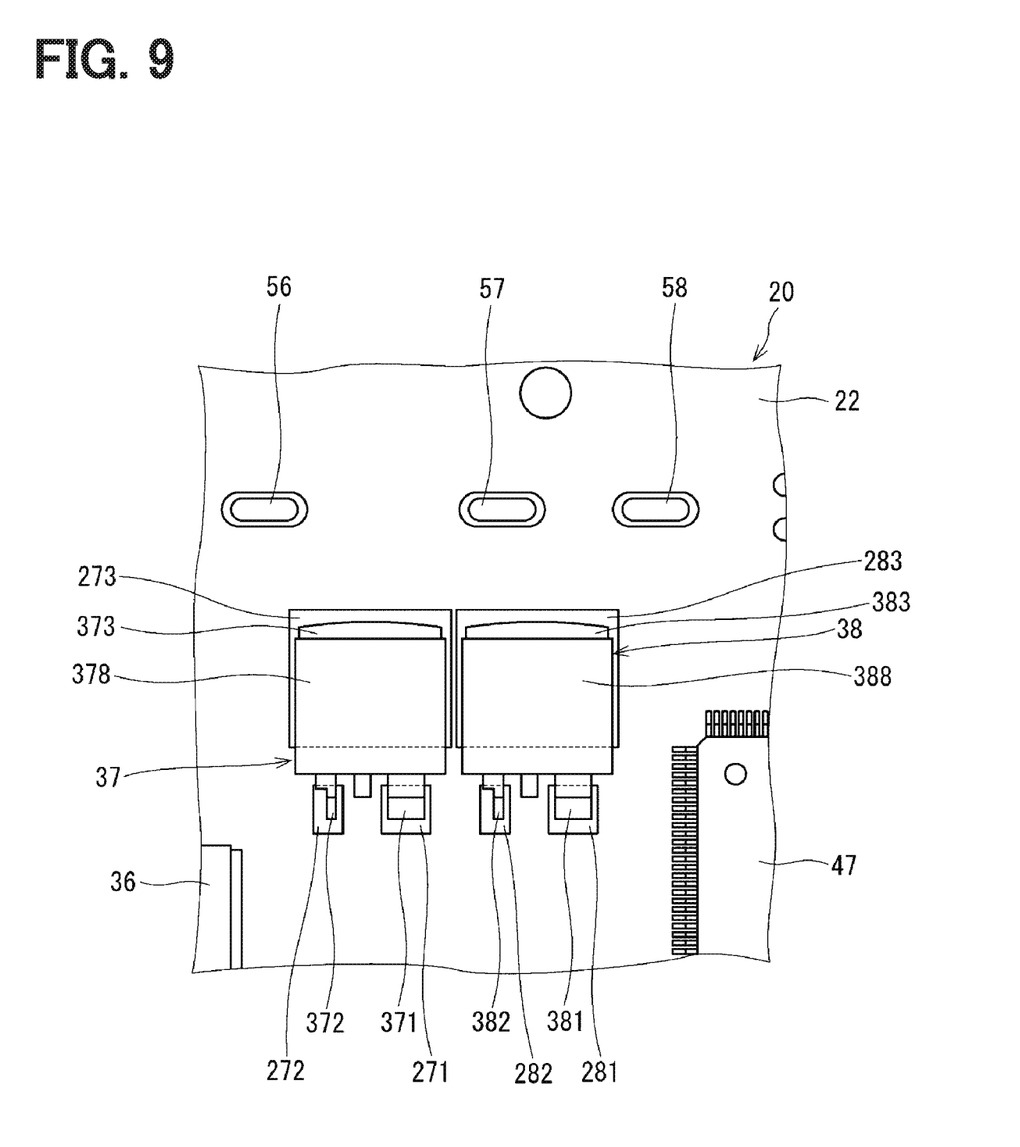
FIG. 9 is a diagram illustrating a plan view for explaining the arrangement of motor relay elements and motor terminals according to the first embodiment.

As shown in FIG. 9, the motor relay element 38 includes a source terminal 381, a gate terminal 382, a drain terminal 383, a chip (not shown), and a sealing portion 388. Since the motor relay element 38 has the similar structure to that of the motor relay element 37, detailed description of the motor relay element 38 is omitted.

As shown in FIGS. 8 and 9, the motor relay elements 37 and 38 are arranged as close as possible to the motor terminals 57 and 58. In the present embodiment, the motor relay elements 37 and 38 are arranged side by side relative to the connector 50 in such a manner that the motor relay element 37 is disposed adjacent to the motor terminal 57, the motor relay element 38 is disposed adjacent to the motor terminal 58, and the motor relay element 37 corresponds to the motor terminal 57, and the motor relay element 38 corresponds to the motor terminal 58.

As shown in FIG. 8, when the motor relay element 37 is projected onto the connector 50, the motor relay element 37 and the motor terminal 57 overlap with each other at least at a part. When the motor relay element 38 is projected onto the connector 50, the motor relay element 38 and the motor terminal 58 overlap with each other at least at a part. In this way, the motor relay elements 37 and 38 are arranged adjacent to the motor terminals 57 and 58. When projected in the similar manner, the motor relay element 37 partially overlaps also with the motor terminal 58. In this case, however, it is considered that the motor relay element 37 corresponds to the motor terminal 57 as having a larger overlapping area with the motor terminal 57 than the motor terminal 58. The motor relay elements 37 and 38 are mounted on the substrate 20 such that the drain terminals 373 and 383, which are the widest terminals, face the connector 50.

As shown in FIG. 9, source patterns 271 and 281, gate patterns 272 and 282, drain patterns 273 and 283, which are all wiring patterns, are partially exposed on the second surface 22 of the substrate 20 at least at a part. The source terminal 371 of the motor relay element 37 is connected to the source pattern 271, and the gate terminal 372 of the motor relay element 37 is connected to the gate pattern 272. The drain terminal 373 of the motor relay element 37 is connected to the drain pattern 273. The source terminal 381 of the motor relay element 38 is connected to the source pattern 281, and the gate terminal 382 of the motor relay element 38 is connected to the gate pattern 282. The drain terminal 383 of the motor relay element 38 is connected to the drain pattern 283.

Figure 10:
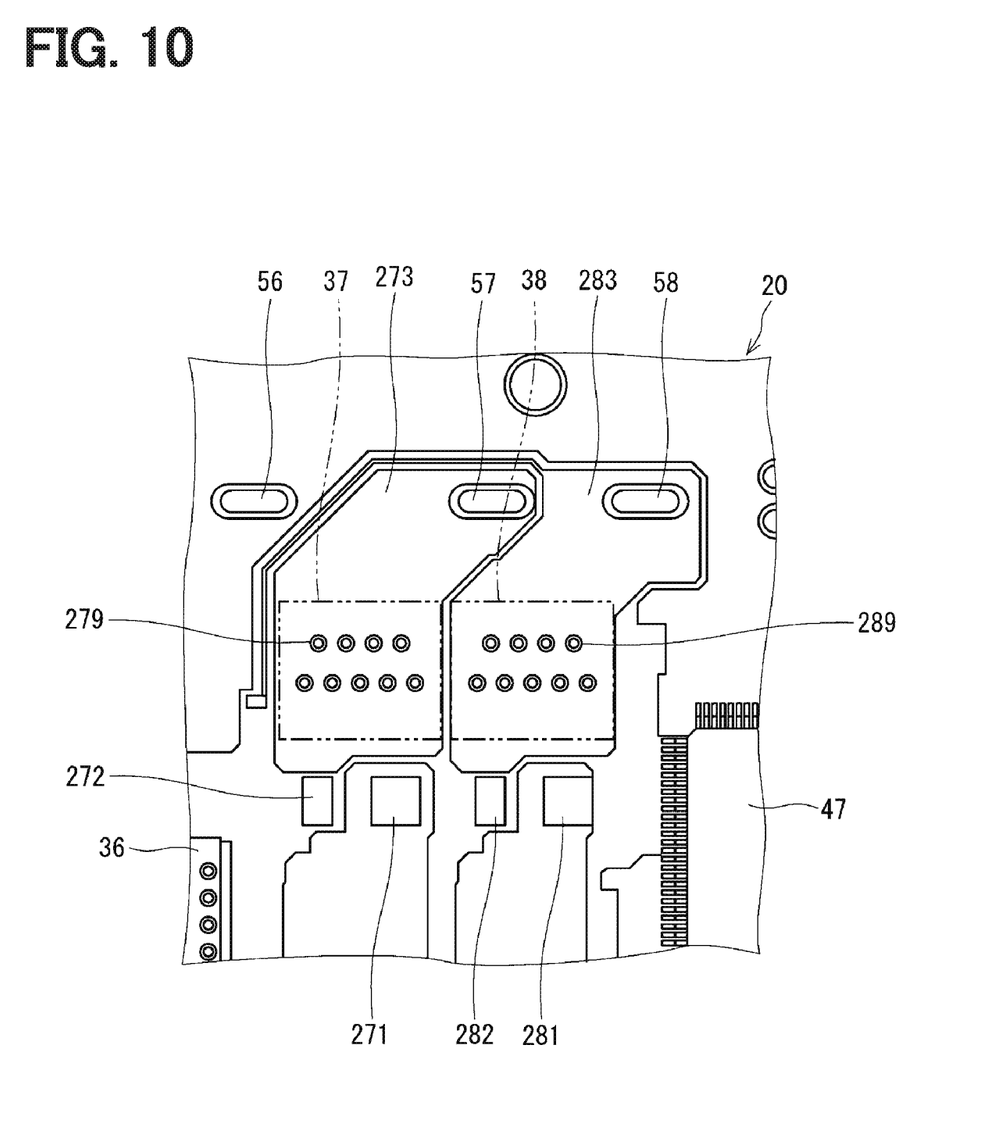
FIG. 10 is a diagram illustrating a plan view for explaining wiring patterns for connecting the motor relay elements and the motor terminals according to the first embodiment.

As shown in FIG. 10, the motor relay element 37 is electrically connected to the motor terminal 57 via the drain pattern 273. The motor relay element 38 is connected to the motor terminal 58 via the drain pattern 283. Therefore, heat of the motor relay element 37 is radiated toward the connector 50 via the drain pattern 273 and the motor terminal 57. Likewise, heat of the motor relay element 38 is radiated toward the connector 50 via the drain pattern 283 and the motor terminal 58.

The drain patterns 273 and 283 are formed to extend up to connection positions between the motor terminals 57 and 58 and the substrate 20 with the width equal to or greater than that of the motor relay elements 37 and 38. In order to avoid vias or the like, a slight decrease of the width of each of drain patterns 273 and 283 is allowable, and should be regarded as "equal to or greater". In the present embodiment, in the circuit configuration, the drains of the motor relay elements 37 and 38 and the winding 81 are connected. Therefore, the drain terminals 373 and 383 are arranged adjacent to and facing the connector 50, and thus the drain patterns 273 and 283 can be formed to extend toward the connector 50 with the wide width. As a result, the drain patterns 273 and 283 can have a relatively simple shape, and the heat of the motor relay elements 37 and 38 can be radiated toward the connector 50 with high efficiency. Vias 279 and 289 are formed in regions of the drain patterns 273 and 283 where the motor relay elements 37 and 38 are mounted. Since the vias 279 and 289 are provided, the heat radiation efficiency is increased. Note that FIG. 10 illustrates the substrate 20 in a state where an insulating layer is removed from the second surface 22 of the substrate 20.

In the present embodiment, the motor relay elements 37 and 38 are correspondingly arranged for the two motor terminals 57 and 58. There are no other components mounted between the motor terminals 57 and 58 and the motor relay elements 37 and 38. Therefore, it can be understood that the motor terminals 57 and 58 and the motor relay elements 37 and 38 are arranged adjacent to each other. The distance between the motor relay elements 37 and 38 and the corresponding motor terminals 57 and 58 is shorter than distances between the power terminals 55 and 56 and the control terminal 59, which are the other terminals of the connector 50, and the components mounted on the substrate 20 other than the motor relay elements 37 and 38. In other words, the motor relay elements 37 and 38 are arranged closest to the corresponding motor terminals 57 and 58, as compared to the other elements mounted on the substrate 20.

Therefore, the heat generated from the two motor relay elements 37 and 38 can be radiated toward the connector 50 via the relatively short thermal paths, as compared with the case where a part of the motor relay elements 37 and 38 is arranged separate from the motor terminals 57 and 58. As such, the heat generated in accordance with the electric conduction to the motor relay elements 37 and 38 can be radiated toward the connector 50 with high efficiency.

The chips 375 are mounted on the motor relay elements 37 and 38. Since the drain terminals 373 and 383, which have the largest land areas, are arranged adjacent to the connector 50, the heat radiation efficiency toward the connector 50 can be further improved. In addition, since the drain patterns 273 and 283 are formed to have the wide width, the heat radiation efficiency toward the connector 50 can be further improved.

As a reference example, a case where the motor relay elements 37 and 38 are mounted on the first surface 21 and the heat of the motor relay elements 37 and 38 is radiated to the housing 60 will be described. In the case where the heat of the motor relay elements 37 and 38 is radiated to the housing 60 by, for example, heat radiation from the back side, the heat sink portion 65 needs to be in a shape close to the motor relay elements 37 and 38. In such a case, therefore, the weight of the housing 60 may increase or the shape of the housing 60 may be complicated. Further, in a case where heat radiation gel is used between the housing 60 and the motor relay elements 37 and 38, the amount of use of the heat radiation gel increases, and the number of steps increases due to application of the heat radiation gel.

In this embodiment, since the heat radiation efficiency from the motor relay elements 37 and 38 toward the connector 50 is improved, the motor relay elements 37 and 38 are mounted on the second surface 22, which is the surface opposite to the housing 60. Therefore, as compared with the case where the motor relay elements 37 and 38 are provided on the first surface 21 to radiate the heat toward the housing 60, the shape of the housing 60 can be simplified and the weight can be reduced. Further, since the motor relay elements 37 and 38 are mounted on the second surface 22 and the housing 60 has the sink portion 65 in a region corresponding to the switching elements 31 to 34, the accommodation space 67 is formed between the substrate 20 and the base portion 61 of the housing in the region other than the heat sink portion 65. Since the capacitor 42, which is the relatively large component, is arranged in the accommodation space 67, the space can be effectively used and the electronic control unit 10 can be reduced in size.

As described hereinabove, the electronic control unit 10 is used for controlling the driving of the motor 80 having the winding 81, and includes the substrate 20, the plurality of switching elements 31 to 34, the motor relay elements 37 and 38, and the connector 50. The switching elements 31 to 34 are mounted on the substrate 20 and constitute the inverter circuit 30 for switching electric conduction to the winding 81. The motor relay elements 37 and 38 are mounted on the substrate 20 and connected between the inverter circuit 30 and the winding 81. The connector 50 has the plurality of motor terminals 57 and 58 connected to the winding 81, and is connected to the substrate 20.

All of the motor relay elements 37 and 38 are arranged adjacent to the corresponding motor terminals 57 and 58, respectively. In the present embodiment, the motor relay element 37 is arranged adjacent to the motor terminal 57, and the motor relay element 38 is arranged adjacent to the motor terminal 58. Here, "arranged adjacent to" means an arrangement state where no other member is provided therebetween.

In the present embodiment, all of the motor relay elements 37 and 38 are disposed adjacent to the corresponding motor terminals 57 and 58. Therefore, the heat generated from the motor relay elements 37 and 38 can be appropriately radiated toward the connector 50. Further, since it is not necessary to radiate the heat of the motor relay elements 37 and 38 to, for example, the heat sink portion 65 of the housing 60, the shape of the heat sink portion 65 can be simplified and the weight of the electronic control unit 10 can be reduced, as compared with the case where the heat of the motor relay elements 37 and 38 is radiated to the heat sink portion 65.

The electronic control unit 10 further includes the housing 60 to which the substrate 20 is fixed. The switching elements 31 to 34 are mounted on the first surface 21, which is the surface of the substrate 20 facing the housing 60, and the motor relay elements 37 and 38 are mounted on the second surface 22, which is the surface of the substrate 20 opposite to the housing 60. Since the motor relay elements 37 and 38 of the present embodiment can radiate heat toward the connector 50 via the motor terminals 57 and 58 with high efficiency, there is no need to radiate the heat toward the housing 60. Thus, the motor relay elements 37 and 38 can be mounted on the second surface 22. As such, the degree of freedom of the arrangement layout of the electronic components mounted on the substrate 20 is increased.

The housing 60 is formed with the heat sink portion 65 that rises from the base portion 61 and in contact with the switching elements 31 to 34 so as to radiate heat. Here, the concept of "contacting so as to radiate heat" includes not only a case where the switching elements 31 to 34 and the heat sink portion 65 are in direct contact with each other, but also a case where heat can be radiated through a heat radiating gel or the like. Thus, the heat generated in the switching elements 31 to 34 can be appropriately radiated to the heat sink portion 65.

On the first surface 21 of the substrate 20, the capacitors 42 and the inductor 43, which are tall components taller than the switching elements 31 to 34, are mounted. The capacitors 42 and the inductor 43 are arranged in the accommodation space 67 that is provided on a periphery of the heat sink portion 65 between the base portion 61 and the substrate 20. In the present embodiment, the motor relay elements 37 and 38 are mounted on the second surface 22 to radiate the heat toward the connector 50. Therefore, the region where the heat sink portion 65 is formed is smaller than that in a case where the heat of the motor relay elements 37 and 38 is radiated to the heat sink portion 65. In other words, the accommodation space 67 is formed between the substrate 20 and the base portion 61, which is a region where the heat sink portion 65 is not formed. By arranging the relatively large components, such as the capacitors 42, in the accommodation space 67, the electronic control unit 10 can be reduced in size. In particular, the height of the electronic control unit 10 can be reduced, as compared with the case where the capacitors 42 and the like are mounted on the second surface 22.

The connector 50 has the connector main body 51 and the terminals 55 to 59 including the motor terminals 57 and 58. The connector main body 51 is disposed adjacent to the first surface 21 of the substrate 20. Specifically, at least a part of the connector main body 51 is disposed in the accommodation space 67. As such, the electronic control unit 10 can be reduced in size, as compared with the case where the connector 50 is arranged adjacent to the second surface 22 of the substrate 20. In particular, the height of the electronic control unit 10 can be reduced.

The motor relay element 37 is arranged such that the drain terminal 373, on which the chip 375 is mounted, faces toward the connector 50. Similarly to the motor relay element 37, the motor relay element 38 is arranged such that the drain terminal 383 faces toward the connector 50. As such, the heat generated in the motor relay elements 37 and 38 can be radiated toward the connector 50 with higher efficiency.

The drain patterns 273 and 283, which are wiring patterns of the substrate 20 connected to the drain terminals 373 and 383 arranged facing toward the connector 50, are extended up to the connection positions between the motor relay terminals 57 and 58 and the substrate 20 with the width equal to or greater than the width of the surface of the motor relay elements 37 and 38 facing the connector 50. As such, the heat generated in the motor relay elements 37 and 38 can be radiated toward the connector 50 with higher efficiency via the drain patterns 273 and 283.

In the present embodiment, the motor 80 is a brushed motor, and the inverter circuit 30 is the H-bridge circuit. There are two motor relay elements 37 and 38. The drain of the motor relay element 37, which is one of the two motor relay elements, is connected to one end of the winding 81, and the drain of the motor relay element 38, which is the other of the two motor relay elements, is connected to the other end of the winding 81. In the circuit configuration in which the drains of the motor relay elements 37 and 38 and the winding 81 are connected to each other, when the drain terminals 373 and 383 are arranged to face toward the connector 50, the shape of the drain patterns 273 and 283, which are wiring patterns connecting the motor relay elements 37 and 38 and the motor terminals 57 and 58, can be simplified. Further, since the pattern areas of the drain patterns 273 and 293 can be ensured relatively large, the heat of the motor relay elements 37 and 38 can be radiated toward the connector 50 with higher efficiency.

The electric power steering apparatus 8 includes the electronic control unit 10 and the motor 80. In the electronic control unit 10 used in the electric power steering apparatus 8, since a large amount of current is conducted to the switching elements 31 to 34 and the motor relay elements 37 and 38, a large amount of heat generated. In the present embodiment, the heat of the motor relay elements 37 and 38 is radiated toward the connector 50 via the motor terminals 57 and 58, and hence the electronic control unit 10 can be reduced in size. Accordingly, the overall size of the electric power steering apparatus 8 can be reduced.

Second Embodiment

Figure 14:
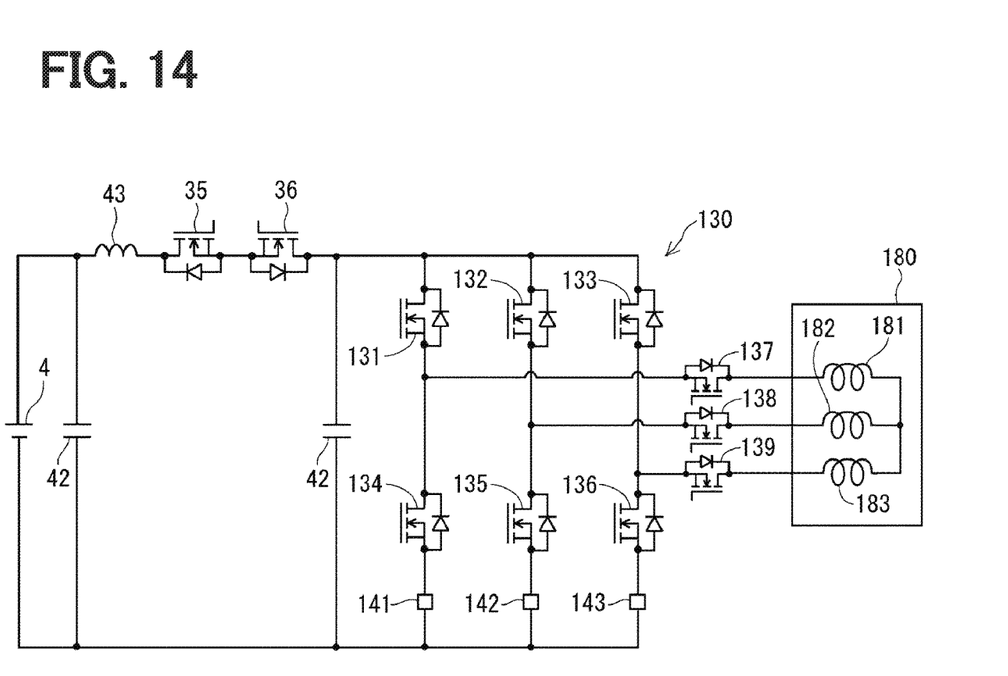
FIG. 14 is a circuit diagram illustrating a circuit configuration of an electronic control unit according to a second embodiment.
Figure 15:
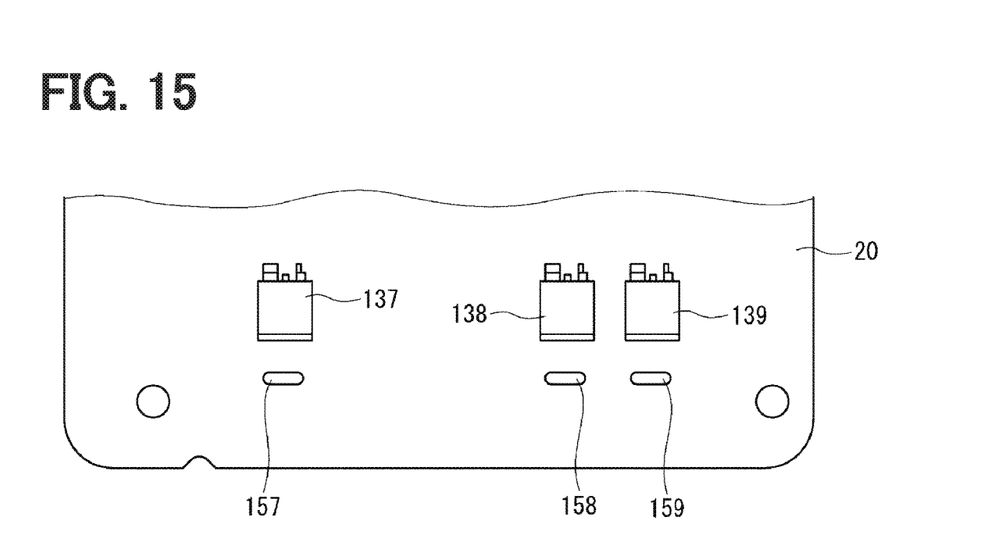
FIG. 15 is a diagram illustrating a plan view for explaining the arrangement of motor relay elements and motor terminals according to the second embodiment.

A second embodiment of the present embodiment is shown in FIGS. 14 and 15. In the present embodiment, a motor 180 is a three-phase motor having windings 181 to 183. An inverter circuit 130 is a three-phase inverter having switching elements 131 to 136. The switching elements 131 to 133 are connected on a high potential side, and the switching elements 134 to 136 are connected on a low potential side. A connection point of the switching elements 131 and 134, which are paired and form a U-phase, is connected to an end of a U-phase winding 181 via a motor relay element 137. A connection point of the switching elements 132 and 135, which are paired and form a V-phase, is connected to an end of a V-phase winding 182 via a motor relay element 138. A connection point of the switching elements 133 and 136, which are paired and form a W-phase, is connected to an end of a W-phase winding 183 via a motor relay element 139. The other ends of the windings 181 to 183 are connected to each other.

Shunt resistors 141 to 143 are provided on low potential sides of the switching elements 134 to 136, and are used to detect electric currents flowing in the windings 181 to 183. The motor relay elements 137 to 139 are connected such that drains are adjacent to the windings 181 to 183.

The arrangement relationship between the motor relay elements 137 to 139 and the motor terminals 157 to 159 is shown in FIG. 15. In FIG. 15, components other than the substrate 20, the motor relay elements 137 to 139, and the motor terminals 157 to 159 are omitted, and the arrangement relationship is schematically shown. The motor terminals 157 to 159 are formed so as to protrude from the connector main body 51 (not shown in FIG. 15), and are connected to the substrate 20. The motor relay element 137 of the U-phase is arranged adjacent to motor terminal 157, which is connected to the U-phase winding 181. The motor relay element 138 of the V-phase is arranged adjacent to motor terminal 158, which is connected to the V-phase winding 182. The motor relay element 139 of the W-phase is arranged adjacent to motor terminal 159, which is connected to the W-phase winding 183.

The details of the motor relay elements 137 to 139 are similar to those of the motor relay elements 37 and 38 of the above-described embodiment, and the motor relay elements 137 to 139 are arranged with the drain terminals being adjacent to the motor terminals 157 to 159. Similarly to the above-described embodiment, the drain patterns, which are the wiring patterns of the substrate 20 connected to the drain terminals, are extended up to connection position between the motor terminals 157 to 159 and the substrate 20, with the width equal to or greater than the width of the motor relay elements 137 to 139. Also in such a configuration, advantageous effects similar to those of the above-described embodiment can be achieved.

OTHER EMBODIMENTS

In the embodiments described hereinabove, all of the motor relay elements are connected such that the drains are adjacent to the winding. As another embodiment, at least a part of the motor relay elements may be connected such that the source is adjacent to the winding. In the embodiments described hereinabove, all of the motor relay elements are mounted on the substrate such that the drain terminals face toward the connector. As another embodiment, at least a part of the motor relay elements may be mounted on the substrate such that a terminal other than the drain terminal faces toward the connector. In the embodiments described hereinabove, the motor relay elements have the chips on the drain terminals. As another embodiment, in the motor relay elements, the chip may be mounted on a terminal other than the drain terminal. In such a case, it is preferable that the terminal on which the chip is mounted is arranged to face toward the connector.

In the embodiments described hereinabove, as the wiring patterns, the drain patterns are extended up to the motor terminals to be electrically connected to the motor terminals. As another embodiment, a wiring pattern other than the drain pattern may be extended up to the motor terminal. The wiring pattern extended up to the motor terminal is preferably arranged so as to radiate heat to the motor terminal, and is not always necessary to be electrically connected. In the embodiments described hereinabove, the drain patterns are extended up to the motor terminals with the width equal to or greater than the widths of the motor relay elements. As another embodiment, the wiring pattern to be connected to the motor relay element may have any shape.

In the embodiments described hereinabove, the switching elements, the shunt resistors, the capacitors and the inductor are mounted on the first surface of the substrate, and the motor relay elements, the power supply relay elements, the microcomputer and the custom IC are mounted on the second surface of the substrate. As another embodiment, the components mounted on the substrate may be partly omitted, or another component may be additionally mounted. The arrangement of each component mounted on the substrate may be suitably modified. For example, the motor relay element may be mounted on the first surface of the substrate. Each of the components may be mounted on any of the first and second surfaces of the substrate.

In the embodiments described hereinabove, the electronic control unit is employed to the electric power steering apparatus of so-called "rack assist type". As another embodiment, the electric power steering apparatus may have any configuration of such as a column assist type or a pinion assist type. As another embodiment, the electronic control unit may be employed to an in-vehicle apparatus other than the electric power steering apparatus. Alternatively, the electronic control unit may be employed to an apparatus other than the in-vehicle apparatus. The present disclosure is not limited to the embodiments described hereinabove, and may be modified in various other ways without departing from the gist of the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic control unit for controlling driving of a motor having a winding, the electronic control unit comprising:
    a substrate;
    a plurality of switching elements mounted on a first surface of the substrate, and providing an inverter circuit to switch electric conduction to the winding;
    a plurality of motor relay elements mounted on a second surface of the substrate, and connected between the inverter circuit and the winding;
    a connector including a plurality of motor terminals connected to the winding, and connected to the substrate; and
    a housing to which the substrate is fixed, and facing the first surface of the substrate, wherein
    the housing is formed with a heat sink portion that rises from a base portion of the housing and is in contact with the plurality of switching elements to enable heat radiation,
    all of the plurality of motor relay elements are correspondingly arranged adjacent to the plurality of motor terminals,
    the motor is a brushed motor,
    the inverter circuit is an H-bridge circuit,
    all of the plurality of motor relay elements comprises two motor relay elements including a first motor relay element and a second motor relay element,
    all of the plurality of motor terminals comprises two motor terminals including a first motor terminal and a second motor terminal,
    the first motor relay element has a drain connected to one end of the winding through the first motor terminal, and the second motor relay element has a drain connected to the other end of the winding through the second motor terminal,
    the first motor terminal and the second motor terminal are aligned in a first direction along a planar direction of the second surface of the substrate, and
    the first motor relay element and the second motor relay element are aligned in the first direction and are correspondingly arranged adjacent to the first motor terminal and the second motor terminal.

2. The electronic control unit according to claim 1, wherein
    the substrate has a tall component on the first surface, the tall component being taller than the plurality of switching elements, and
    the tall component is arranged in an accommodation space that is provided on a periphery of the heat sink portion between the base portion and the substrate.

3. The electronic control unit according to claim 1, wherein
    the connector has a connector main body and a plurality of connection terminals including the plurality of motor terminals, and
    the connector main body is arranged adjacent to the first surface of the substrate.

4. The electronic control unit according to claim 1, wherein
    the plurality of motor relay elements is arranged such that terminals on which chips are mounted face toward the connector.

5. The electronic control unit according to claim 1, wherein
the substrate has a plurality of wiring patterns to be connected to terminals of the motor relay elements that are arranged to face toward the connector, and
the plurality of wiring patterns each extends up to a position where a corresponding motor terminal is connected to the substrate with a width equal to or greater than a width of a surface of the motor relay element facing toward the connector.

6. An electric power steering apparatus comprising:
the electronic control unit according to claim 1; and
the motor.

7. The electronic control unit according to claim 1, further comprising:
a first power supply relay element and a second power supply relay element mounted on the second surface of the substrate, wherein
the connector further includes a first power supply terminal and a second power supply terminal electrically connected to the first power supply relay element and the second power supply relay element, respectively,
the first power supply terminal and the second power supply terminal are aligned with the first motor terminal and the second motor terminal in the first direction, and
a distance between the first and second motor relay elements and the first and second motor terminals in a second direction orthogonal to the first direction and along the planar direction of the second surface of the substrate is shorter than a distance between the first and second power supply relay elements and the first and second power supply terminals in the second direction.

8. The electronic control unit according to claim 7, wherein
a distance between the first and second power supply relay elements and the heat sink portion of the housing in the planar direction of the second surface of the substrate is shorter than a distance between the first and second motor relay elements and the heat sink portion of the housing in the planar direction of the substrate.

9. The electronic control unit according to claim 1, wherein
a distance between the first and second power supply relay elements and the heat sink portion of the housing in the planar direction of the second surface of the substrate is shorter than a distance between the first and second motor relay elements and the heat sink portion of the housing in the planar direction of the substrate.

10. The electronic control unit according to claim 1, wherein
the connector is disposed on the first surface of the substrate, and connected to the first and second motor relay elements on the second surface of the substrate through the first and second motor terminals penetrating the substrate from the first surface to the second surface.

11. The electronic control unit according to claim 1, wherein
the drain connecting the first motor relay element to the one end of the winding through the first motor terminal comprises a first drain pattern,
the drain connecting the second motor relay element to the other end of the winding through the second motor terminal comprises a second drain pattern, and
a width of each of the first drain pattern and the second drain pattern in the first direction is equal to or greater than a width of each of the first motor relay element and second motor relay element.

* * * * *